US007562809B2

United States Patent
Chua et al.

(10) Patent No.: US 7,562,809 B2
(45) Date of Patent: Jul. 21, 2009

(54) METHOD FOR DETECTING COMPONENT PLACEMENT ERRORS IN PRODUCT ASSEMBLY AND ASSEMBLIES MADE THEREWITH

(75) Inventors: Janet Bee Yin Chua, Jalan Bruas (MY); Eit Thian Yap, Jalan Sejahtera Indah (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 379 days.

(21) Appl. No.: 11/433,021

(22) Filed: May 11, 2006

(65) Prior Publication Data

US 2007/0262131 A1 Nov. 15, 2007

(51) Int. Cl.
*G06F 17/00* (2006.01)
(52) U.S. Cl. .................. 235/375; 235/376; 356/153; 356/399; 356/400; 33/286
(58) Field of Classification Search .......... 356/153, 356/399, 400; 385/52; 33/286; 235/375; 206/718; 53/367
See application file for complete search history.

(56) References Cited

U.S. PATENT DOCUMENTS

| 4,698,491 | A | * | 10/1987 | Lysen | 356/152.3 |
|---|---|---|---|---|---|
| 5,730,528 | A | * | 3/1998 | Allison et al. | 374/161 |
| 6,362,883 | B1 | * | 3/2002 | Watkins | 356/399 |
| 7,300,163 | B2 | * | 11/2007 | Scampini | 353/103 |

* cited by examiner

*Primary Examiner*—Michael G Lee
*Assistant Examiner*—Rafferty Kelly

(57) ABSTRACT

An article and a method for testing the assembly of that article are disclosed. The article includes a plurality of modules, at least two of the modules are capable of being placed in two different positions in the article, each module having a correct position in the article. Each module includes an aperture at a location determined by the desired position for that module in the article. The apertures are placed such that the apertures will be aligned to form a transparent channel when the modules are arranged in a predetermined pattern with respect to one another, but not when arranged in any of the possible incorrect orders. The article can be tested for assembly errors by transmitting a test light signal into the first end and testing for light that traversed all of said first transparent channel.

26 Claims, 6 Drawing Sheets

METHOD FOR DETECTING COMPONENT PLACEMENT ERRORS IN PRODUCT ASSEMBLY AND ASSEMBLIES MADE THEREWITH

BACKGROUND OF THE INVENTION

Many products are assembled from components that have similar outward appearances. When these products are assembled, there is a class of errors that result from the assembler assembling the components in the wrong order. In many cases, these errors lead to products that perform incorrectly. In some cases, the errors can be detected during a testing phase of the final product, and the defective products returned to the assembly plant for repair. In other cases, the resultant assembly errors lead to intermediate failures that are not always detected when the product is tested.

For example, consider an electronic product in which a large number of printed circuit cards are plugged into a bus and all of the card connectors on the bus are identical. Hence, any card can fit in any slot. In many cases, the cards are also similar in size and appearance to one another. If any card will function in any slot, this does not pose a problem. However, in some cases, there are restrictions as to the locations of some of the cards. For example, two of the cards may need to be placed in adjacent card slots, or one or more of the cards will only function properly if placed in certain slots. If a placement error occurs, the error may not be detected until the final product is tested. In some cases, the failure resulting from misplacement of the cards will not be detected immediately, because the misplacement leads to intermittent failures in the final product. For example, the final product can have a race problem that only appears when the product has been running for an extended period of time or when other activities on the bus are present.

In principle, such placement errors can be avoided by including some form of interlock or identification mechanism on the printed circuit cards and card connectors. For example, each card could include an identification code that can be read by a test system connected to the bus. In such a system, each card slot would also need to be addressable in a manner that allows the test system to determine the identification code of the card in that slot. The test system could then identify misplaced cards. Unfortunately, such a system can substantially increase the cost of the final system.

For example, if the cards and connectors each have a computer readable identification number, a test program can match the cards against the connectors. However, in many cases, the back plane on which the card connectors are mounted does not include the capability of uniquely identifying each connector in a manner that can be read by a test program. Furthermore, the cost of providing such electronically readable identification on each card can also be significant, particularly in systems in which the same card can be used in different products at different locations. In the latter case, some form of jumper is typically used to set the card identification. The jumpers are internal to the cards and not easily readable by an assembly technician. Furthermore, an error in setting the jumper can also lead to products being returned from the testing facility because of an apparent assembly error resulting from a misplaced jumper. In addition, it should be noted that this solution is only possible in the case in which the assembler of the product using the cards also controls the manufacture of the cards and the bus. If one or more of the critical cards are purchased from an outside source, such modifications could be prohibitively expensive, since they would require the outside vendor to modify its production line.

In other cases, the components may not have any form of easily readable identification system to utilize in testing the assembly of the components. For example, non-electrical products having a number of similar mechanical components that are assembled into a finished product lack the ability to apply the above-described testing scheme.

SUMMARY OF THE INVENTION

The present invention includes an article and a method for testing the assembly of that article. The article includes a plurality of modules, at least two of the modules are capable of being placed in two different positions in the article, each module having a correct position in the article. Each module includes an aperture. The aperture is transparent to light and is placed at a location determined by the desired position for that module in the article. The apertures are placed such that the apertures will be aligned to form a first transparent channel when the modules are arranged in a predetermined pattern with respect to one another. The first transparent channel is not formed if the modules are arranged in a different pattern. The first transparent channel has first and second ends that define the beginning and end of the first transparent channel, at least one of the ends being open and capable of receiving a light signal.

In one aspect of the invention, the first transparent channel includes a surface that generates a return light signal when illuminated with light from a test light signal. In another aspect of the invention, the aperture in one of the modules includes a strip affixed to that module, and the strip includes a transparent region having a placement on the strip determined by the correct position for that module.

The article can be tested to determine if the modules are in the correct positions by transmitting a test light signal into the first end and testing for light that traversed all of said first transparent channel.

DETAILED DESCRIPTION OF THE PREFERRED EMBODIMENTS OF THE INVENTION

Figure 1:
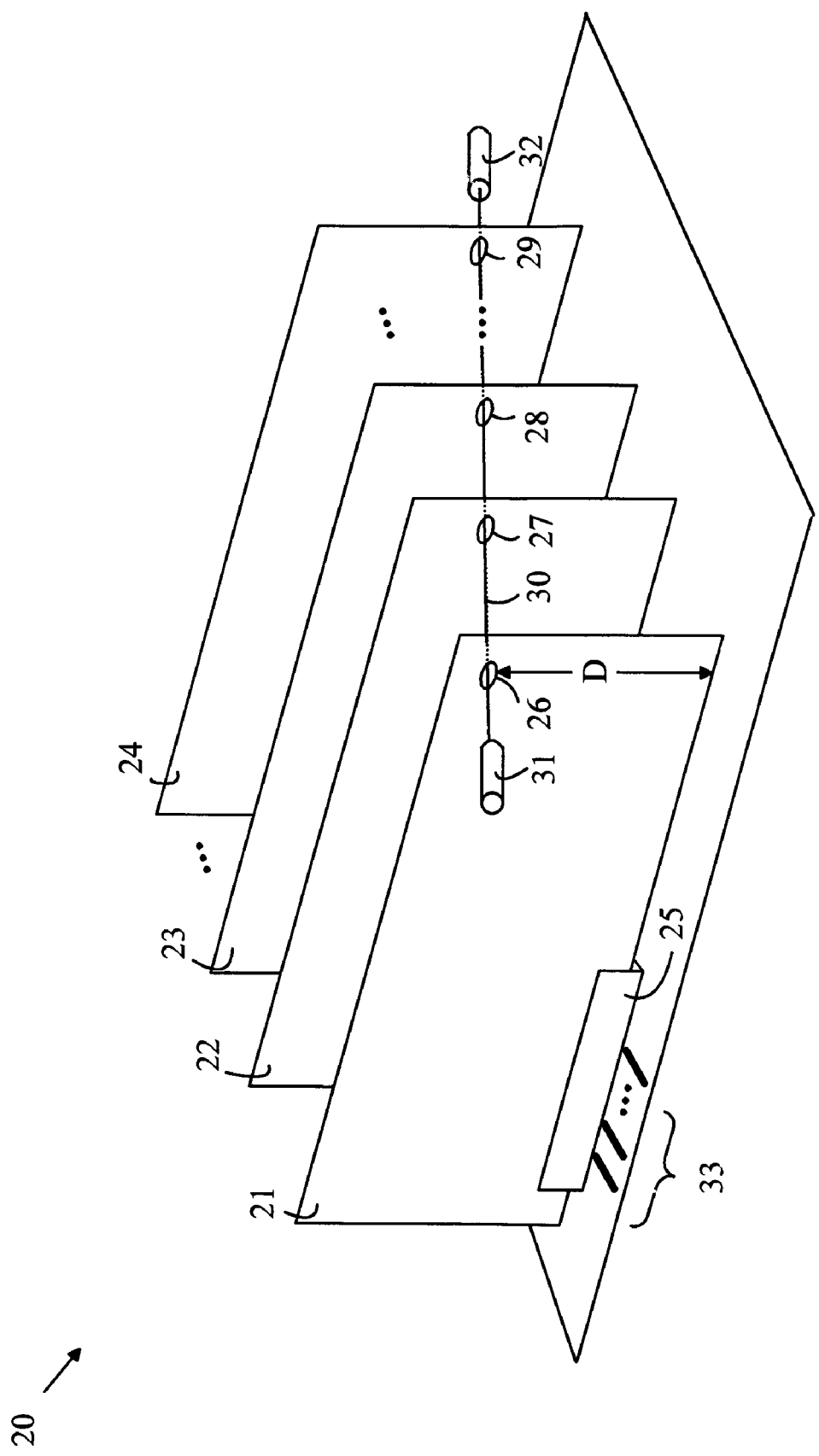
FIG. 1 illustrates an electronic assembly having a plurality of similar printed circuit cards plugged into a bus.

The manner in which the present invention provides its advantages can be more easily understood with reference to FIG. 1, which illustrates an electronic assembly having a plurality of similar printed circuit cards plugged into a bus. Exemplary printed circuit cards are shown at 21-24. The cards are connected to a bus 33 by connectors 25. Each printed circuit card utilizes the same form of connector, and hence, each printed circuit card could, in principle, be placed in any connector on bus 33. Each printed circuit card also includes a small hole as shown at 26-29. The holes are positioned such that the hole on each card is at a different distance, D, from the bottom of the card. The distance, D, is chosen such that the holes are aligned along a line 30 when the printed circuit cards are in the correct order. The assembly technician can test for the correct assembly by positioning a light source 31 to emit light along the line and looking for light leaving hole 29. The exit light can be sensed electronically with a photodiode such as photodiode 32. Alternatively, the technician can place a small screen such as a piece of paper behind the last printed circuit card and look for a spot of light on that screen.

Figure 2:
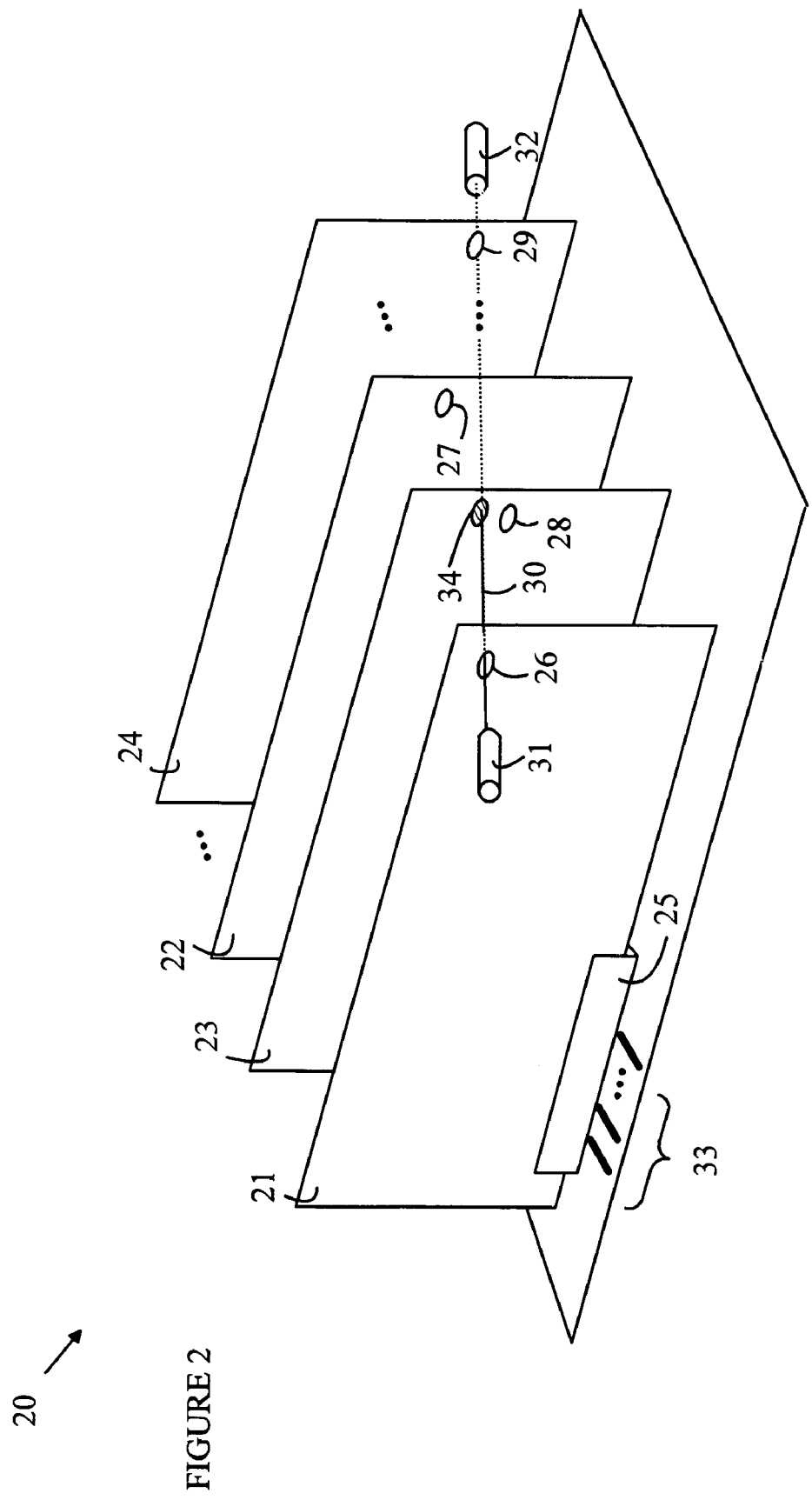
FIG. 2 illustrates the assembly shown in FIG. 1 with two of the printed circuit cards out of order.

Refer now to FIG. 2, which illustrates the assembly shown in FIG. 1 with two of the printed circuit cards out of order. In the case shown in the figure, printed circuit cards 22 and 23 are reversed. In this case, holes 27 and 28 will no longer be aligned along line 30, and the light beam from light source 31 will be blocked at printed circuit card 23 as shown at 34. Hence, no light will reach detector 32, and the technician will know that there is a card placement error. In addition, by examining the printed circuit cards to see which one has a light spot on the printed circuit card, i.e., light spot 34, the technician can easily find the first printed circuit card that is out of place and correct the problem.

The above-described embodiments of the present invention utilize holes that are bored in the printed circuit cards to form a light channel that transmits light when the printed circuit cards are properly aligned. These embodiments assume that the assembler can provide such holes. However, there may be cases in which the printed circuit cards do not have sufficient space to bore such holes or the cost of modifying the cards by drilling holes prior to assembly is prohibitive.

Figure 3:
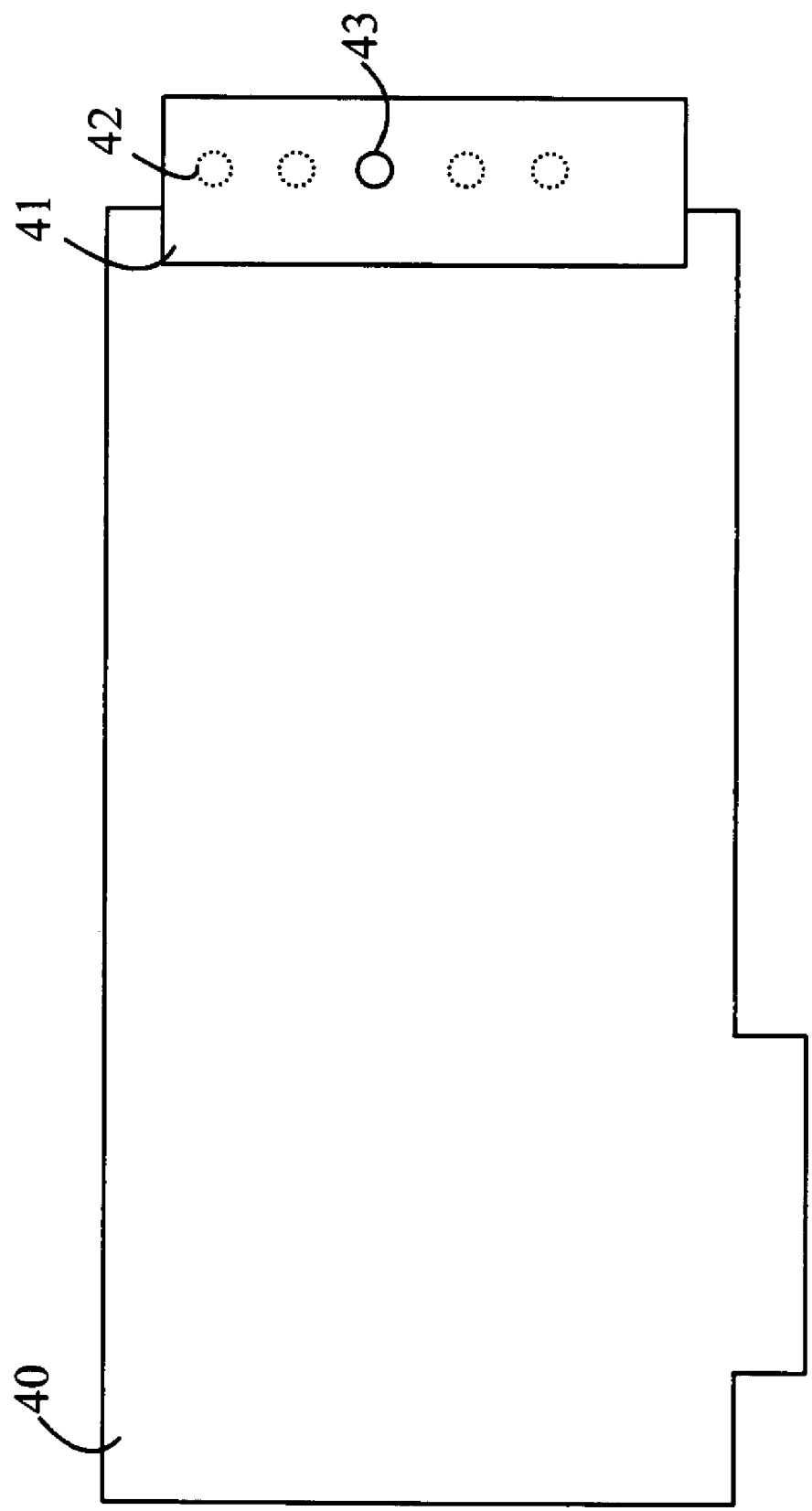
FIG. 3 illustrates one mechanism for providing the required hole or holes in an assembly component according to one embodiment of the present invention.

Refer now to FIG. 3, which illustrates one mechanism for providing the required hole or holes in an assembly component according to one embodiment of the present invention. To simplify the following discussion, the example of a printed circuit card will again be utilized. It is assumed that circuit card 40 cannot be drilled to provide a required alignment hole on the edge thereof. In this case, a separate control strip 41 is attached to an edge of circuit card 40. Control strip 41 extends from the edge of circuit card 40 and includes a number of predefined locations 42 that can be punched to provide a hole at one of a predetermined number of locations. Prior to assembly, the strips are punched at the desired location, e.g. 43, and attached to the circuit cards. The circuit cards that are to be assembled in different locations have different holes punched prior to the circuit cards being delivered to the assembly line.

The control strips can be constructed from any suitable material. Strips made from paper with perforations at the relevant locations can provide an economical method for providing quality control in the assembly process. The paper needs only be thick enough to remain sufficiently rigid during the assembly and testing process to assure that the holes will be properly aligned if the cards are in the correct order. It should be noted that after the assembled parts have passed the inspection process, the control strips could be removed by tearing the strip off of the circuit card. Alternatively, an adhesive that allows the control strips to be temporarily affixed to the circuit cards could also be utilized. Such adhesives are well known in the art and are utilized for providing paper notes that can be affixed and then removed from a surface without leaving an adhesive residue.

The above-described embodiments of the present invention are adapted for relatively simple assemblies in which the components are aligned along a single dimension such that a single alignment path can be created to test for the correct placement of the components. However, embodiments that operate on more complex three-dimensional assemblies can also be constructed by utilizing multiple alignment paths.

Figure 4:
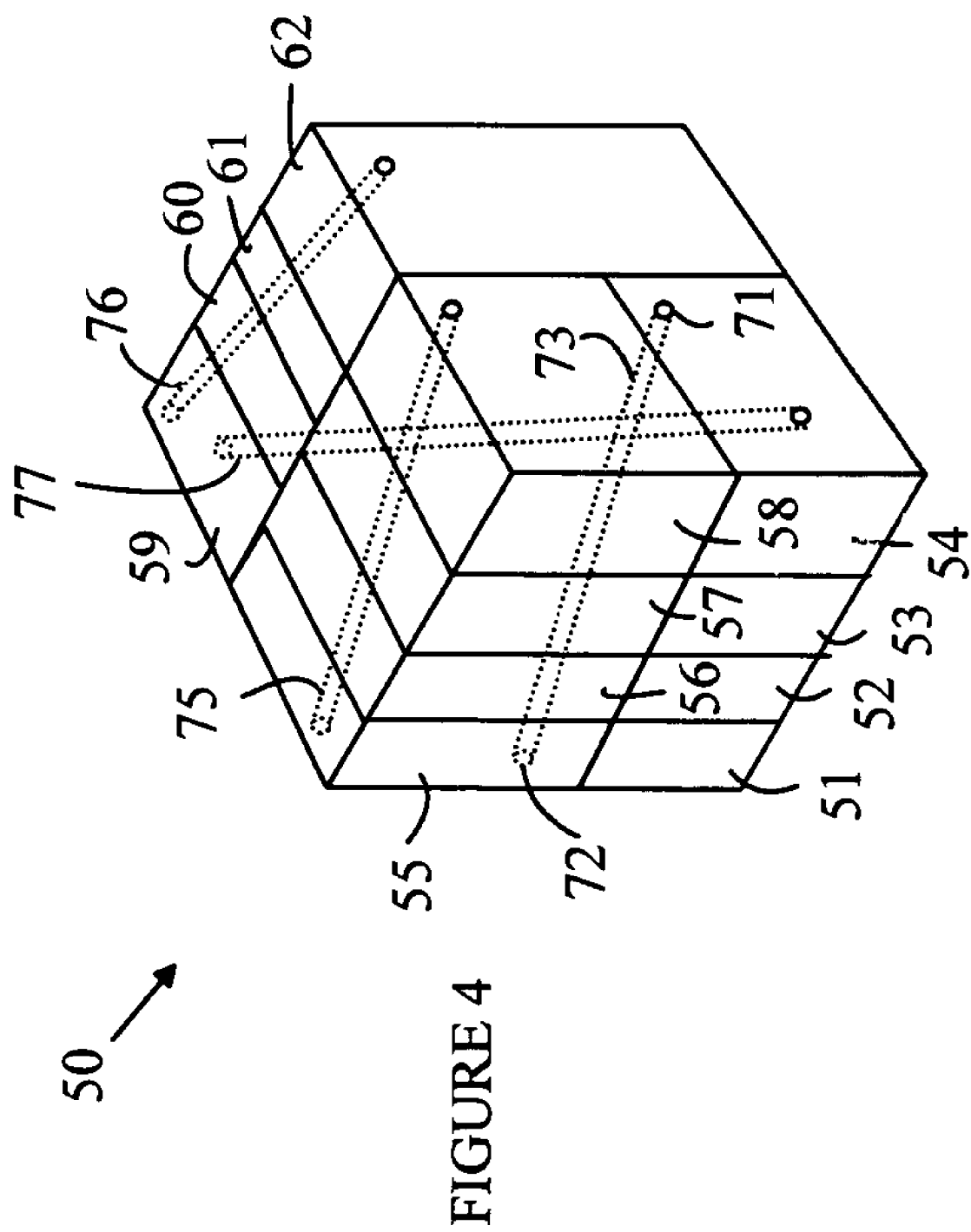
FIG. 4 illustrates a three-dimensional assembly according to another embodiment of the present invention.

Refer now to FIG. 4, which illustrates a three-dimensional assembly according to another embodiment of the present invention. Assembly 50 is constructed from a number of modules shown at 51-62. The modules can be viewed as being organized into sub-assemblies. Modules 51-54 makeup one sub-assembly; modules 55-58 makeup a second sub-assembly, and modules 59-62 makeup a third sub-assembly. Each of the modules in a sub-assembly includes a channel for testing those modules in a manner similar to that discussed above. For example, the modules in the first sub-assembly include channels that align to generate a light path 73. When a light source is applied at the end of the channel labeled 71, light will exit the assembly through the corresponding hole labeled 72 if the sub-assembly has the correct modules in the correct order. If a module is out of place or the wrong module is in one of the positions, no light will be received through hole 72. Similarly, the modules in the second sub-assembly include channels that align to form a light path 75 that can be used to test that sub-assembly, and the modules in the third sub-assembly include channels that align to form a light path 76 that can be used to test that sub-assembly.

Light passing through light paths 73, 75, and 76 provide assurance that the sub-assemblies have each been correctly assembled. However, there is still the possibility that the sub-assemblies have been miss-assembled relative to one another. To rule out such an error, a fourth light path 77 is provided. Light path 77 passes through each of the sub-assemblies in a manner that assures that light will not pass through light path 77 if one of the sub-assemblies is in an incorrect position. Light path 77 is constructed from a second set of channels that are present in selected ones of the modules.

Figure 6:
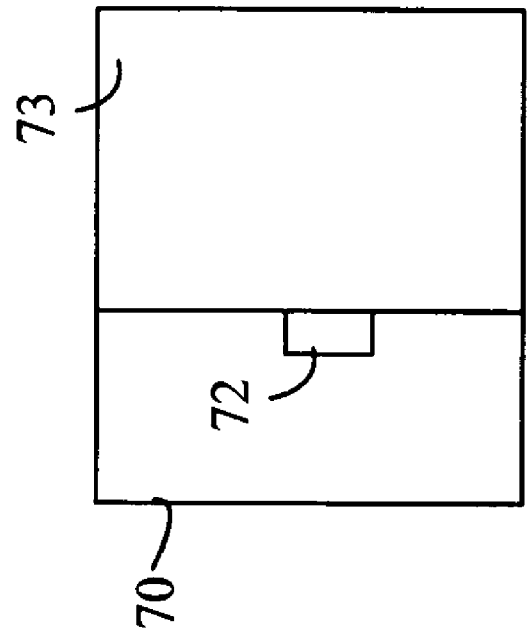
FIGS. 5 and 6 illustrate a component having a body in which a light-conducting channel is formed by cutting or molding a channel in the surface of the component.
Figure 5:
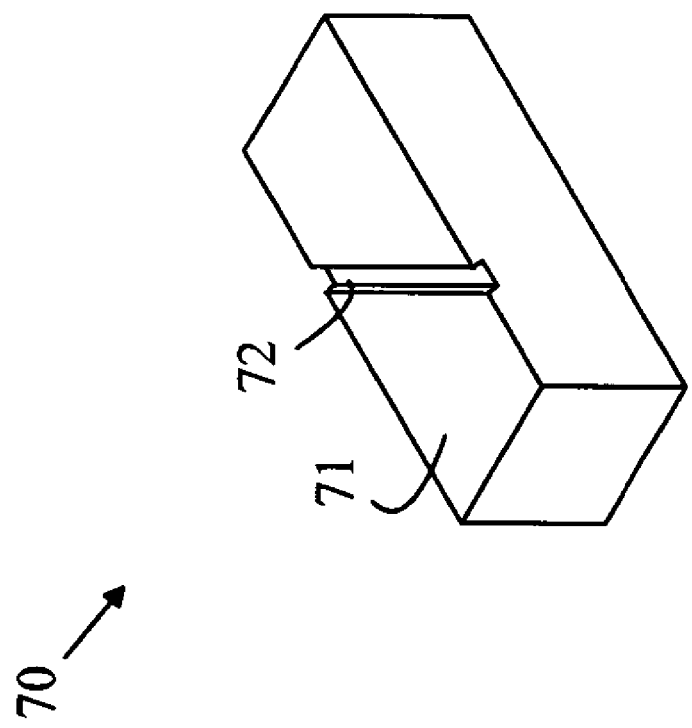

The above-described embodiments of the present invention utilize light conducting channels that are constructed by placing holes in barriers or drilling holes through the component. However, other forms of light conducting channels can be provided in the components. Refer now to FIGS. 5 and 6, which illustrate a component 70 having a body 71 in which a light conducting channel 72 is formed by cutting or molding a channel in the surface of the component. When module 70 is placed against another module 73 or a flat surface during testing, a closed channel is formed that can function in the same manner as the channels discussed above. It should also be noted that the channel can be used without being closed by a surface of another module or other cover if the light source used in the test system is sufficiently collimated to prevent stray light from reaching the detector. The arrangement shown in FIG. 4 is advantageous for modules that have unused surface areas that are sufficiently thick to allow the channel to be cut without damaging the components that are internal to the module. This type of surface channel can also be created by affixing a test layer having the channel formed therein in a manner analogous to the control strips discussed above with reference to FIG. 3.

The embodiments of the present invention described above utilize channels that are created by providing holes or other form of aperture through a portion of the module or add-on strip attached to the module. However, it will be appreciated that any form of clear opening that acts to form a clear channel when all modules are correctly assembled can be utilized. For example, the channels shown in FIG. 4 could be filled with a clear plastic to provide a sealed unit. In addition, the apertures do not need to be of uniform cross-sectional area along the light channel created by the apertures.

Figure 7:
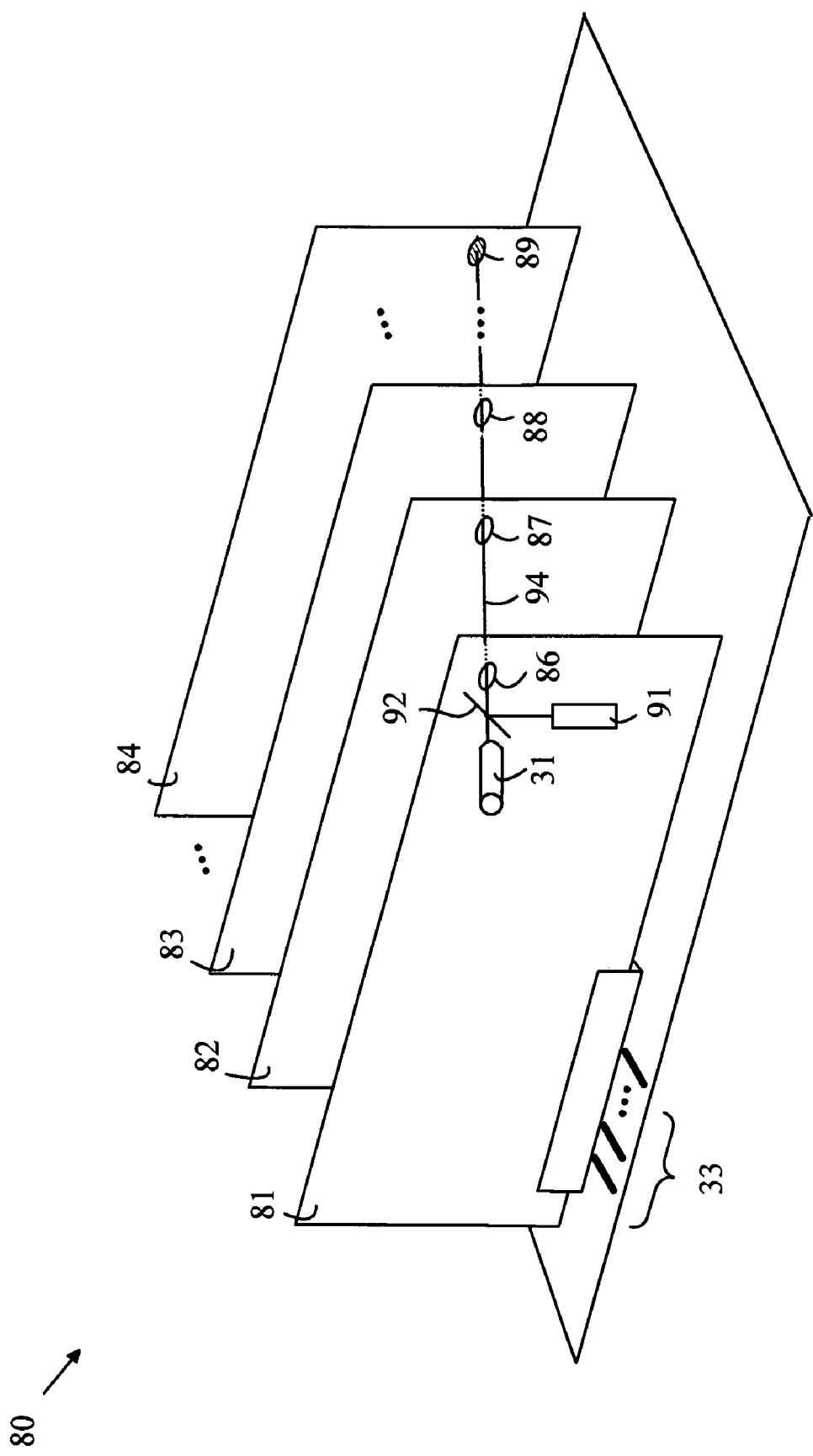
FIG. 7 illustrates an electronic assembly having a plurality of similar printed circuit cards plugged into a bus in a manner similar to that described above with respect to FIG. 1.

The above embodiments of the present invention utilize a testing arrangement in which a light signal is introduced into one end of the test channel and light is detected leaving the other end. In some cases, this arrangement can pose problems. For example, the article may not have sufficient space to position the detector at one end of the channel. In another case, the end module in the series may not support an aperture passing through that module at the desired location. Refer now to FIG. 7, which illustrates an electronic assembly having a plurality of similar printed circuit cards plugged into a bus in a manner similar to that described above with respect to FIG. 1. Exemplary printed circuit cards are shown at 81-84. The cards are connected to bus 33. For the purposes of this example, it will be assumed that printed circuit card 84 cannot be drilled to provide the final hole of the test path. Alternatively, the space available behind printed circuit card 84 may not be sufficient in size or location to allow a detector to be placed behind printed circuit card 84.

Article 80 overcomes this problem by using spot 89 on printed circuit card 84 to generate a return light signal that is detected by a photodetector 91 that is located at the end of the test path that includes light source 31. In one embodiment, spot 89 can be a reflector that merely reflects the light signal generated by light source 31 back down the test path. The reflector can be affixed to printed circuit card 84 by an insulating adhesive, and hence, does not require printed circuit 84 to have an area devoid of circuitry at the desired location. In addition, this arrangement only requires that the test system have access to one end of the test path. Some of the light that leaves aperture 86 is diverted to detector 91 by a partially silvered mirror 92. It should be noted that the portion of the light signal from light source 31 that is reflected by mirror 92 on route to aperture 86 is reflected away from detector 91.

In another embodiment, spot 89 includes a phosphor that generates a return light signal having a spectrum that is different from the spectrum of the light signal generated by light source 31. In this case, detector 91 could include filters that differentiate between the two light signals, and hence, eliminate any interference from the input light signal. As noted above, detector 91 can be replaced by a screen that is viewed by the technician performing the assembly test. In this case, the light from light source 31 could have a spectrum in the near UV and the phosphor could be chosen to convert this light to light of a particular color that would appear on the screen to indicate that the assembly is correct.

Various modifications to the present invention will become apparent to those skilled in the art from the foregoing description and accompanying drawings. Accordingly, the present invention is to be limited solely by the scope of the following claims.

What is claimed is:

1. An article comprising:
   a first subassembly incorporating a first light transmissive area located at a first distance from an edge of the first subassembly; and
   a second subassembly incorporating a second light transmissive area located at a second distance from an edge of the second subassembly, the second distance being different than the first distance and selected to enable the first and the second subassemblies to form a first pre-defined light transmission path when the first and the second subassemblies are correctly assembled in the article, the first predefined light transmission path defined in part by a first non-orthogonal angle of incidence of light projected upon the first light transmissive area.

2. The article of claim 1, wherein the first non-orthogonal angle of incidence is selected to preclude the projected light from being orthogonally incident upon the second light transmissive area of the second subassembly after passing through the first light transmissive area of the first subassembly.

3. The article of claim 1, further comprising:
   a light source configured for projecting light upon the first light transmissive area, the light source arranged in a first angular tilt that further defines the first pre-defined light transmission path, the first angular tilt selected to conform to the first non-orthogonal angle of incidence; and
   a photodetector arranged for receiving light emerging from the second light transmissive area in the second assembly after passage through the first light transmissive area in the first assembly.

4. The article of claim 1, further comprising:
   a third subassembly incorporating a third light transmissive area located at a third distance from an edge of the third subassembly, the third distance being different than each of the first and the second distances, and selected to enable the first, the second, and the third subassemblies to form the first pre-defined light transmission path when the first, the second, and the third subassemblies are correctly assembled in a first, a second, and a third position respectively in the article.

5. The article of claim 4, wherein each of the first, second, and third distances is selected in order to block transmission of light through the first predefined light transmission path when at least one of the first, the second, and the third subassemblies is incorrectly assembled in a non-corresponding position amongst the first, second, and third positions in the article.

6. The article of claim 4, further comprising:
   a fourth subassembly incorporating a fourth light transmissive area located at a fourth distance from an edge of the fourth subassembly; and
   a fifth subassembly incorporating a fifth light transmissive area located at a fifth distance from an edge of the fifth subassembly, the fifth distance being different than the fourth distance and selected to enable the fourth and the fifth subassemblies to form a second pre-defined light transmission path when the fourth and the fifth subassemblies are assembled in the article, the second pre-defined light transmission path being different than the first predefined light transmission path and defined in part by a second non-orthogonal angle of incidence for light projected upon the fourth light transmissive area.

7. The article of claim 6, further comprising:
   a sixth light transmissive area located at a sixth distance from an edge of the first subassembly; and
   a seventh light transmissive area located at a seventh distance from an edge of the fourth subassembly, the sixth and seventh distances selected to enable the first and the fourth subassemblies to form a third pre-defined light transmission path when the first and the fourth subassemblies are assembled in the article.

8. The article of claim 1, wherein the first light transmissive area is located in an object that is attachable to the first subassembly, the object containing markings thereon to indicate potential locations for the first light transmissive area.

9. The article of claim 8, wherein the first light transmissive area is an aperture that is formed at one of the potential locations on the object.

10. The article of claim 9, wherein the object is a test strip that is attached to the first subassembly for product assembly testing, the product assembly testing comprising a first test to verify that the first and the second subassemblies have been assembled in the article at a predefined first and a predefined second position respectively.

11. The article of claim 10, wherein the test strip is a paper test strip.

12. The article of claim 8, wherein the first light transmissive area is an aperture that is formed in one of a) a first of the potential locations on the object when it is determined that the first subassembly is to be assembled at a first position in the article, or b) a second of the potential locations on the object when it is determined that the first subassembly is to be assembled at a second position in the article.

13. The article of claim 1, wherein the first light transmissive area is a hole that is provided in the first subassembly.

14. The article of claim 1, wherein the first light transmissive area is an area containing a material that permits a partial propagation of light through the first light transmissive area.

15. The article of claim 1, further comprising:
a third subassembly incorporating a reflector area that is at least partially reflective, the reflector area located at a third distance from an edge of the third subassembly, the third distance being different than each of the first and the second distances and selected so as to locate the reflector area at a distal end of the first pre-defined light transmission path when the first, the second, and the third subassemblies are assembled in a first, a second, and a third position respectively in the article.

16. The article of claim 15, wherein the reflector area comprises a phosphor that is selected to emit light of a second wavelength when light of a first wavelength is incident upon the phosphor.

17. A method for assembling an article comprising a plurality of subassemblies, the method comprising:
mounting a first subassembly in a first position in the article, the first subassembly incorporating a first light transmissive area located at a first distance from an edge of the first subassembly;
mounting a second subassembly in a second position in the article, the second subassembly incorporating a second light transmissive area located at a second distance from an edge of the second subassembly, the second distance being different than the first distance;
directing a beam of light into the first light transmissive area, the beam of light being directed upon the first light transmissive area at a first non-orthogonal angle that is selected to preclude light being orthogonally incident upon the second light transmissive area; and
detecting the beam of light after propagation through the first and the second light transmissive areas thereby testing for conformance that the first and the second subassemblies have been mounted in the respective first and second positions.

18. The method of claim 17, further comprising:
mounting a third subassembly in a third position in the article, the third subassembly incorporating a third light transmissive area located at a third distance from an edge of the third subassembly, the third distance being different than each of the first and second distances; and
detecting the beam of light after propagation through the first, second, and third light transmissive areas thereby testing for conformance that the first, second, and third subassemblies have been mounted in the respective first, second, and third positions.

19. The method of claim 17, further comprising:
mounting a third subassembly in a third position located between the first and the second positions in the article; and
failing to detect the beam of light propagating through the second light transmissive area of the second subassembly, and concluding thereon that a) the third subassembly has been incorrectly located in the article, or b) the third subassembly does not contain a third light transmissive area configured to permit passage of light through the third subassembly.

20. The method of claim 17, further comprising:
mounting a third subassembly in a third position in the article, the third subassembly incorporating a reflector area that is at least partially reflective, the reflector area located at a third distance from an edge of the third subassembly, the third distance being different than each of the first and the second distances and selected so as to locate the reflector area at a distal end of a first predefined light transmission path when the first, the second, and the third subassemblies are assembled in the first, second, and third positions respectively in the article; and
confirming that the first, second, and third subassemblies have been correctly assembled in the article by detecting a reflected beam of light emitted out of the first light transmissive area, the reflected beam of light resulting from the directed beam of light having propagated in a forward direction through the first and second light transmissive areas of the first and the second subassemblies respectively, reflecting off the reflector area in the third subassembly, and propagating back through the second and the first light transmissive areas of the second and the first subassemblies respectively.

21. The method of claim 20, further comprising:
failing to detect the reflected beam and concluding thereon that at least one of the second and the third subassemblies has been mounted incorrectly in the article.

22. The method of claim 21, further comprising:
upon failing to detect the reflected beam, detecting light that is incident upon the second subassembly at a spot other than the second light transmissive area and concluding thereon that the second subassembly has been mounted incorrectly in the article.

23. The method of claim 21, further comprising:
upon failing to detect the reflected beam, detecting light that is incident upon the third subassembly at a spot other than the reflector area and concluding thereon that the third subassembly has been mounted incorrectly in the article.

24. An article comprising:
a first subassembly that is installable in: a) a first location in the article, or b) a second location in the article, wherein the first location is the desired location for installing the first subassembly; and
a first test strip configured for attachment to the first subassembly, the first test strip containing a set of markings that identify a plurality of alternative locations for forming a light transmissive area, thereby accommodating the selection of a first one amongst the set of markings to form the light transmissive area that is located at a first distance from an edge of the first test strip and that permits passage of a test beam of light projected along a pre-defined light transmission path for verifying that the first subassembly has been correctly installed at the first location in the article, the predefined light transmission path defined in part by a non-orthogonal angle of incidence that is selected such that the test beam of light is blocked if the first subassembly is installed in the second location in the article.

25. The article of claim 24, further comprising:

a second subassembly that is installable in: c) a third location in the article, or d) a fourth location in the article, wherein the third location is the desired location for installing the second subassembly; and a second test strip configured for attachment to the second subassembly, the second test strip containing said set of markings thereby accommodating the selection of a second one amongst the set of markings to form the light transmissive area at a second distance that is different than the first distance and that permits passage of said test beam of light for verifying that the second subassembly has been correctly installed at the third location in the article, and wherein the test beam of light is blocked if the second subassembly is installed in the fourth location in the article.

26. The article of claim 25, wherein the third location is the same as said second location.

* * * * *